United States Patent
Lee et al.

(10) Patent No.: US 9,572,250 B2
(45) Date of Patent: Feb. 14, 2017

(54) PRINTED CIRCUIT BOARD AND METHOD FOR MANUFACTURING THE SAME

(75) Inventors: Sang Myung Lee, Seoul (KR); Sung Woon Yoon, Seoul (KR); Hyuk Soo Lee, Seoul (KR); Sung Won Lee, Seoul (KR); Ki Do Chun, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 95 days.

(21) Appl. No.: 13/997,464

(22) PCT Filed: Dec. 23, 2011

(86) PCT No.: PCT/KR2011/010024
§ 371 (c)(1),
(2), (4) Date: Nov. 15, 2013

(87) PCT Pub. No.: WO2012/087058
PCT Pub. Date: Jun. 28, 2012

(65) Prior Publication Data
US 2014/0069705 A1    Mar. 13, 2014

(30) Foreign Application Priority Data

Dec. 24, 2010  (KR) .................. 10-2010-0134488
Dec. 24, 2010  (KR) .................. 10-2010-0134489

(51) Int. Cl.
*H05K 3/46*      (2006.01)
*H05K 1/02*      (2006.01)
(Continued)

(52) U.S. Cl.
CPC .......... *H05K 1/0298* (2013.01); *H05K 3/064* (2013.01); *H05K 3/388* (2013.01); *H05K 3/428* (2013.01);
(Continued)

(58) Field of Classification Search
CPC ...... H05K 1/0298; H05K 3/064; H05K 3/388; H05K 3/428
(Continued)

(56) References Cited

U.S. PATENT DOCUMENTS 5,326,643 A * 7/1994 Adamopoulos .... C08G 73/1003
                                                    428/209
5,744,758 A * 4/1998 Takenouchi ...... H01L 23/49827
                                                    174/255
(Continued)

FOREIGN PATENT DOCUMENTS

EP        1093163 A2    4/2001
JP        09181422 A    7/1997
(Continued)

OTHER PUBLICATIONS

International Search Report in International Application No. PCT/KR2011/010024, filed Dec. 23, 2011.
(Continued)

*Primary Examiner* — Timothy Thompson
*Assistant Examiner* — Michael F McAllister
(74) *Attorney, Agent, or Firm* — Saliwanchik, Lloyd & Eisenschenk (57) ABSTRACT

Disclosed are a printed circuit board and a method for manufacturing the same. The printed circuit board includes a core insulating layer, at least one via formed through the core insulating layer, an inner circuit layer buried in the core insulating layer, and an outer circuit layer on a top surface or a bottom surface of the core insulating layer, wherein the via includes a first part, a second part below the first part, a third part between the first and second parts, and at least one barrier layer including a metal different from a metal of the first to third parts. The inner circuit layer and the via are simultaneously formed so that the process steps are reduced.

(Continued)

Since odd circuit layers are provided, the printed circuit board has a light and slim structure.

13 Claims, 7 Drawing Sheets

(51) Int. Cl.
    *H05K 3/06*     (2006.01)
    *H05K 3/38*     (2006.01)
    *H05K 3/42*     (2006.01)

(52) U.S. Cl.
    CPC ........... *H05K 3/4682* (2013.01); *H05K 3/4647* (2013.01); *H05K 3/4652* (2013.01); *H05K 2201/0341* (2013.01); *H05K 2203/0376* (2013.01)

(58) Field of Classification Search
    USPC .......................................................... 174/262
    See application file for complete search history.

(56) References Cited

U.S. PATENT DOCUMENTS

| | | | |
|---|---|---|---|
| 7,253,512 B2* | 8/2007 | Powell | H05K 3/4617 257/686 |
| 7,548,430 B1* | 6/2009 | Huemoeller | H01L 21/4857 174/262 |
| 2001/0020548 A1* | 9/2001 | Burgess | B23K 26/0853 174/262 |
| 2002/0106516 A1* | 8/2002 | Sato | C08G 59/4042 428/413 |
| 2002/0131229 A1* | 9/2002 | Jones | H05K 3/462 361/262 |
| 2002/0160219 A1* | 10/2002 | Brenneman | H05K 3/025 428/626 |
| 2003/0155653 A1* | 8/2003 | Iijima | H05K 3/4038 257/758 |
| 2005/0150686 A1* | 7/2005 | Powell | H05K 3/4617 174/262 |
| 2005/0153059 A1* | 7/2005 | Wakizaka | C23C 18/2006 427/96.1 |
| 2006/0131176 A1* | 6/2006 | Hsu | C25D 5/022 205/125 |
| 2007/0185297 A1* | 8/2007 | Tanaka | B32B 7/04 528/10 |
| 2007/0243402 A1* | 10/2007 | Sato et al. | 428/606 |
| 2007/0281464 A1* | 12/2007 | Hsu | 438/624 |
| 2007/0287285 A1 | 12/2007 | Tseng et al. | |
| 2010/0230145 A1* | 9/2010 | Holcomb | 174/257 |
| 2010/0233476 A1 | 9/2010 | Uchida et al. | |

FOREIGN PATENT DOCUMENTS

| | | | |
|---|---|---|---|
| JP | 2001-177240 A | | 6/2001 |
| JP | 2003133711 A | | 5/2003 |
| JP | 2004-165544 A | | 6/2004 |
| JP | 2004-265930 A | | 9/2004 |
| JP | 2005-064203 | * | 3/2005 |
| JP | 2005-064203 A | | 3/2005 |
| JP | 2008-124370 | * | 5/2008 |
| JP | 2008-124370 A | | 5/2008 |
| JP | 2008294432 A | | 12/2008 |
| JP | 2009-076699 A | | 4/2009 |
| TW | M307931 U | | 3/2007 |
| TW | 200803659 A | | 1/2008 |
| WO | WO-2007/148666 A1 | | 12/2007 |

OTHER PUBLICATIONS

Notice of Allowance dated Nov. 26, 2012 in Korean Application No. 10-2010-0134489, filed Dec. 24, 2010.

Office Action dated Jul. 21, 2015 in Japanese Application No. 2013-546027.

Office Action dated Jan. 12, 2016 in Japanese Application No. 2013-546027.

Office Action dated May 4, 2016 in Taiwanese Application No. 100147415.

\* cited by examiner

FIG. 1

Prior Art

PRINTED CIRCUIT BOARD AND METHOD FOR MANUFACTURING THE SAME

CROSS-REFERENCE TO RELATED APPLICATIONS

This application is the U.S. national stage application of International Patent Application No. PCT/KR2011/010024, filed Dec. 23, 2011, which claims priority to Korean Application Nos. 10-2010-0134488, filed Dec. 24, 2010, and 10-2010-0134489, filed Dec. 24, 2010, the disclosures of each of which are incorporated herein by reference in their entirety.

TECHNICAL FIELD

A printed circuit board is formed by printing circuit line patterns on an insulating substrate using a conductive material such as copper. The printed circuit board refers to a board before electronic parts have been mounted thereon. That is, the printed circuit board refers to a circuit board, in which mounting positions are defined on a flat plate to mount various types of electronic devices and circuit patterns are fixedly printed on the flat plate to connect the electronic devices with each other.

BACKGROUND ART

Such a printed circuit board (PCB) may be classified into a single-layer PCB and a multi-layer PCB, such as a build-up board.

The build-up board, that is, the multi-layer PCB is manufactured one-layer by one-layer and the quality of the multi-layer PCB is evaluated to improve the product yield of the multi-layer PCB. In addition, interconnection lines are precisely connected to manufacture a high-density and small-size PCB. According to the build-up process, interconnection lines are formed between layers to connect the layers to each other through via holes formed in the layers. Instead of a mechanical drilling work, a laser process is performed to form the via holes having a micro size.

Figure 1:
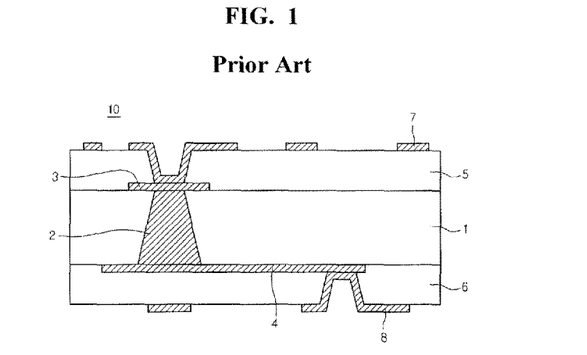
FIG. 1 is a sectional view showing a printed circuit board according to the related art.

FIG. 1 is a sectional view showing a multi-layer PCB according to the related art.

Referring to FIG. 1, the multi-layer PCB 10 according to the related art includes a core insulating layer 1, inner circuit pattern layers 3 and 4 formed on and under the core insulating layer 1, upper and lower insulating layers 5 and 6 burying the inner circuit pattern layers 3 and 4 and outer circuit pattern layers 7 and 8 formed on the upper and lower insulating layers 5 and 6, respectively.

A conductive via 2 and conductive via holes are formed in the core insulating layer 1 and the upper and lower insulating layers 5 and 6 to electrically connect the inner circuit pattern layers 3 and 4 to the outer circuit pattern layers 7 and 8.

The multi-layer PCB 10 having the above structure according to the related art can be manufactured by forming even circuit pattern layers (four layers are shown in FIG. 1). After depositing insulating layers, two layers serving as outer layers are electrically connected to each other through the drilling work or the laser process. However, since the number of the circuit pattern layers is limited to the even number, a thickness of the substrate may be increased, so that the multi-layer PCB 10 may not be applicable for the portable electronic appliances or the substrates having the light and slim structure, such as semiconductor chips.

DISCLOSURE OF INVENTION

Technical Problem

The embodiment provides a printed circuit board having a novel structure and a method for manufacturing the same.

The embodiment provides a printed circuit board including odd circuit layers and a method for manufacturing the same.

Solution to Problem

A printed circuit board according to the embodiment includes a core insulating layer, at least one via formed through the core insulating layer, an inner circuit layer buried in the core insulating layer, and an outer circuit layer on a top surface or a bottom surface of the core insulating layer, wherein the via includes a first part, a second part below the first part, a third part between the first and second parts, and at least one barrier layer including a metal different from a metal of the first to third parts.

A method for manufacturing a printed circuit board according to the embodiment includes the steps of preparing a metal substrate having a stack structure including a first metal layer, a second metal layer, a third metal layer and a barrier layer among the first to third metal layers, forming a first part of a via by etching the first metal layer of the metal substrate, forming a connecting part and an inner circuit layer under the first part of the via by etching the second metal layer of the metal substrate, forming a second part of the via under the connecting part by etching the third metal layer of the metal substrate, forming an insulating layer to bury the via, and forming an outer circuit layer on a top surface or a bottom surface of the insulating layer.

Advantageous Effects of Invention

According to the embodiment, the inner circuit layer and the vias are simultaneously formed, so that the process steps can be reduced. In addition, since the printed circuit board includes odd circuit layers, the printed circuit board may have the light and slim structure.

In addition, the vias are buried in the insulating layer of the multi-layer printed circuit board, so the heat dissipation function can be improved. Since the plating method is not adopted to form the vias, the manufacturing cost can be reduced.

Further, the vias and the inner circuit layer are formed by using the metal substrate including a plurality of stacked metals, so the substrate can be prevented from being bent during the manufacturing process.

BEST MODE FOR CARRYING OUT THE INVENTION

Disclosed are a printed circuit board and a method for manufacturing the same. The printed circuit board includes a core insulating layer, at least one via formed through the core insulating layer, an inner circuit layer buried in the core insulating layer, and an outer circuit layer on a top surface or a bottom surface of the core insulating layer, wherein the via includes a first part, a second part below the first part, a third part between the first and second parts, and at least one barrier layer including a metal different from a metal of the first to third parts. The inner circuit layer and the via are simultaneously formed so that the process steps are reduced. Since odd circuit layers are provided, the printed circuit board has a light and slim structure.

Mode for the Invention

Hereinafter, the embodiments will be described with reference to accompanying drawings in detail so that those skilled in the art to which the invention pertains can easily realize the embodiments. However, the embodiments may have various modifications without limitation.

In the following description, when a part is referred to as it includes a component, the part may not exclude other components but further include another component unless the context indicates otherwise.

The thickness and size of each layer shown in the drawings may be exaggerated, omitted or schematically drawn for the purpose of convenience or clarity. In addition, the size of elements does not utterly reflect an actual size. In the following description, the similar components will be assigned with the similar reference numerals.

In the description of the embodiments, it will be understood that, when a layer (or film), a region, or a plate is referred to as being on or under another layer (or film), another region, or another plate, it can be directly or indirectly on the other layer (or film), region, or plate, or one or more intervening layers may also be present.

According to the embodiment, a via and an inner circuit layer are simultaneously formed through the etching process, so that a multi-layer printed circuit board (PCB) including odd circuit layers can be formed without using the plating method.

Hereinafter, the PCB according to the embodiment will be described with reference to FIGS. 2 to 17.

Figure 2:
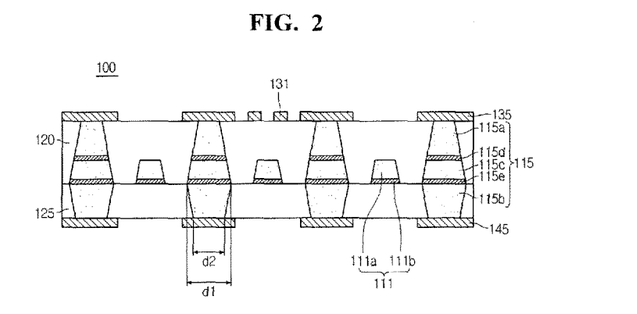
FIG. 2 is a sectional view showing a printed circuit board according to the first embodiment.

FIG. 2 is a sectional view showing the PCB according to the first embodiment.

Referring to FIG. 2, the PCB 100 according to the embodiment includes a core insulating layer forming a first insulating layer 120 and a second insulating layer 125, vias 115 formed in the core insulating layer, an inner circuit layer 111 formed in the core insulating layer, and first and second outer circuit layers 131, 135 and 145 formed on the first and second insulating layers 120 and 125, respectively.

The first insulating layer 120 is formed on the second insulating layer 125 and an additional insulating layer (not shown) may be present between the first and second insulating layers 120 and 125.

The first and second insulating layers 120 and 125 may include a thermosetting polymer substrate, a thermoplastic polymer substrate, a ceramic substrate or an organic/inorganic composite substrate. The first and second insulating layers 120 and 125 may include polymer resin, such as epoxy insulating resin, or polyimide resin. In addition, the first and second insulating layers 120 and 125 can be formed by using resin including solid components, such as glass fiber.

The first and second insulating layers 120 and 125 can be formed by using the same material.

The first and second insulating layers 120 and 125 may have a thickness in the range of 30 μm to 80 μm, respectively.

The thickness of the core insulating layer having the stack structure of the first and second insulating layers 120 and 125 is in the range of 60 μm to 160 μm, preferably, in the range of 60 μm to 140 μm. The vias 115 and the inner circuit layer 111 are formed in the core insulating layer.

The vias 115 are conductive vias formed through the first and second insulating layers 120 and 125. The vias 115 have the largest width d1 at the boundary between the first and second insulating layers 120 and 125. The width of each via 115 is gradually narrowed as it reaches the top surface of the first and second insulating layers 120 and 125. Thus, a section of each via 115 meeting with the top surface of the first and second insulating layers 120 and 125 has the smallest width d2, so that the via 115 has a hexagonal sectional shape.

The widths d1 and d2 of the via 115 are in the range of about 20 μm to about 100 μm.

The via 115 is a conductive via and can be formed by using an alloy including Cu.

The via 115 includes a first part 115a buried in the first insulating layer 120 and formed by an alloy including Cu, a second part 115b buried in the second insulating layer 125 below the first part 115a and formed by an alloy identical to the alloy of the first part 115a, and a third part 115c interposed between the first and second parts 115a and 115b and formed by an alloy identical to the alloy of the first and second parts 115a and 115b.

Meanwhile, first and second barrier layers 115d and 115e are formed at boundaries among the first to third parts 115a, 115b and 115c.

In detail, the first barrier layer 115d is formed between the first part 115a and the third part 115c, and the second barrier layer 115e is formed between the third part 115c and the second part 115b.

The first and second barrier layers 115d and 115e are formed by using a metal different from the metal of the first to third parts 115a, 115b and 115c. The metal of the first and second barrier layers 115d and 115e has the etching selectivity with respect to the metal of the first to third parts 115a, 115b and 115c.

The third part 115c is formed at the center of the via 115, and the bottom surface of the third part 115c or the bottom surface of the second barrier layer 115e may have the largest width d1 of the via 115.

The first to third parts 115a, 115b and 115c can be formed by using the alloy including Cu, and the first and second barrier layers 115d and 115e can be formed by using the alloy including Ni, Fe, Co, Mo, Cr or Pd.

The first and second parts 115a and 115b have the thickness in the range of 20 μm to 70 μm, and the third part 115c has the thickness in the range of 5 μm to 70 μm.

The first and second barrier layers 115d and 115e have the thickness smaller than the thickness of the third part 115c.

Preferably, the first and second barrier layers 115d and 115e have the thickness of about 10 μm or less.

The inner circuit layer 111 is formed on the second insulating layer 125. A circuit pattern of the inner circuit layer 111 has the thickness in the range of 5 μm to 30 μm, and the width of about 50 μm or less, preferably, 30 μm, so that the micro pattern can be formed.

The inner circuit layer 111 has a rectangular sectional shape.

The inner circuit layer 111 is formed by using a material the same as that of the third part 115c of the via 115 and the second barrier layer 115e is partially formed under the inner circuit layer 111.

The second barrier layer 115e can be omitted.

The outer circuit layers 131, 135 and 145 including via pads 135 and 145 connected to the via 115 and the circuit pattern 131 are formed on the top and bottom surfaces of the first and second insulating layers 120 and 125, respectively.

The outer circuit layers 131, 135 and 145 are classified into the first outer circuit layers 131 and 135 formed on the core insulating layer and the second outer circuit layer 145 formed under the core insulating layer.

The outer circuit layers 131, 135 and 145 may form the micro pattern having the line/space of 30/30. To this end, a copper layer having the thickness in the range of 6 μm to 30 μm is deposited and then the copper layer is etched to form the outer circuit layers 131, 135 and 145.

Although it has been described in that the outer circuit layers 131, 135 and 145 are formed on and under the core insulating layer in the form of a single layer, the embodiment is not limited thereto. For instance, after forming an upper insulating layer for burying the outer circuit layers 131, 135 and 145 on the first and second insulating layers 120 and 125, the circuit layer can be formed on the upper insulating layer to form the multi-layer PCB.

As described above, since the inner circuit layer 111 is buried in the core insulating layer of the PCB 100 according to the embodiment, the circuit layer having the number of 2n+1 (n is a positive integer) can be formed. In addition, the insulating layer has the number the same as that of the circuit layer on the basis of the core insulating layer so that the PCB can be prevented from being bent in one direction.

Thus, odd circuit layers can be formed without increasing the number of the insulating layers. In addition, since the vias 115 including the conductive material are formed in the core insulating layer, the heat dissipation efficiency can be improved.

Hereinafter, the method for manufacturing the PCB of FIG. 2 will be described with reference to FIGS. 3 to 17.

Figure 3:
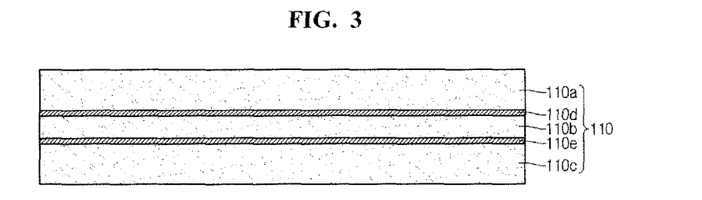
FIGS. 3 to 17 are sectional views for explaining the manufacturing procedure for the printed circuit board shown in FIG. 2.

First, a conductive metal substrate 110 is prepared as shown in FIG. 3.

The conductive metal substrate 110 can be formed by using an alloy including Cu in the form of a rolled foil or an electrolytic foil. The conductive metal substrate 110 may have various thicknesses according to the specification of the product. The conductive metal substrate 110 has the stack structure of a first metal layer 110a, a second metal layer 110b and a third metal layer 110c.

The first to third metal layers 110a, 110b and 110c can be formed by using an alloy including Cu. First and second barrier metal layers 110d and 110e are formed among the first to third metal layers 110a, 110b and 110c. The first and second barrier metal layers 110d and 110e include the metal having the etching selectivity with respect to the metal of the first to third metal layers 110a, 110b and 110c.

The first and second barrier metal layers 110d and 110e can be formed by using an alloy including Ni, Fe, Co, Mo, Cr or Pd. In addition, the first and second barrier metal layers 110d and 110e may have the thickness thinner than the thickness of the second metal layer 110b.

According to the embodiment, the metal substrate 110 preferably has the thickness in the range of 80 μm to 170 μm. The surface of the metal substrate 110 can be treated through a surface treatment process, such as pickling or flushing.

Figure 4:
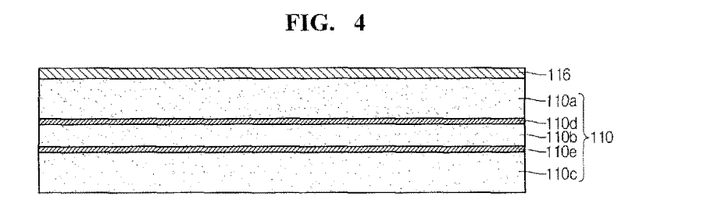

Then, as shown in FIG. 4, a photoresist film 116 is attached onto the top surface of the metal substrate 110.

The photoresist film 116 forms an etching pattern to etch the metal substrate 110. The photoresist film 116 may have various thicknesses in the range of 15 μm to 30 μm, and both of the UV exposure type photoresist film and the LDI exposure type photoresist film can be employed.

Figure 5:
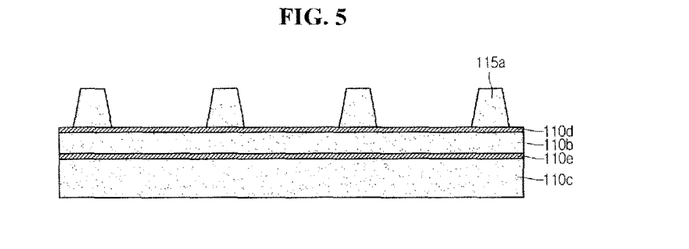

After that, as shown in FIG. 5, the photoresist film 116 is subject to the exposure and development process to form a photoresist pattern (not shown) and the metal substrate 110 is etched by using the photoresist pattern as a mask, thereby forming the first part 115a of the via 115.

Then, a part of the metal substrate 110 is wet etched by using wet etching solution, such as cupric chloride and iron chloride, to form the first part 115a of the via 115. Due to the etching selectivity between the first metal layer 110a and the first barrier metal layer 110d, only the first metal layer 110a is etched when the first part 115a is formed.

As shown in FIG. 5, after the first part 115a of the via 115 has been etched, the photoresist pattern is delaminated by using the NaOH diluted solution.

Figure 6:
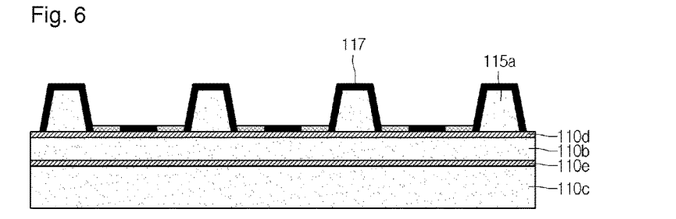

Next, as shown in FIG. 6, a photoresist film 117 is formed on the first part 115a and an exposed front surface of the first barrier metal layer 110d.

Figure 7:
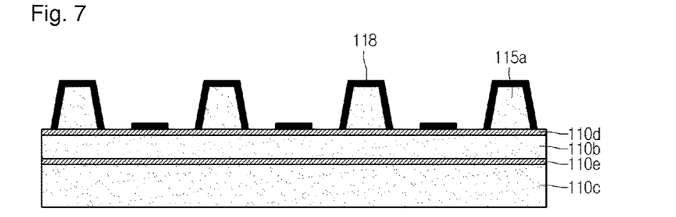

In order to form the inner circuit layer 111 by using the second metal layer 110b, a part of the photoresist film 117 formed on the first barrier metal layer 110d is subject to the exposure and development process to form a photoresist pattern 118 shown in FIG. 7 and the first barrier metal layer 110d is etched by using the photoresist pattern 118 as a mask, thereby forming a mask pattern 119.

Figure 8:
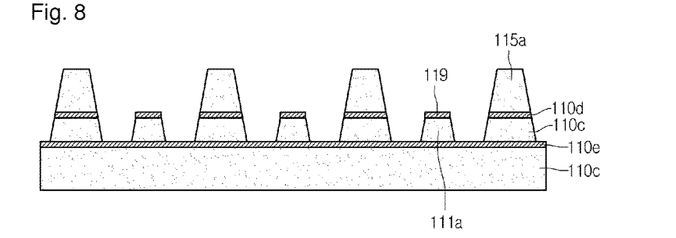

Then, the second metal layer 110b formed under the mask pattern 119 is selectively etched by using an etching solution different from the etching solution used for etching the mask pattern 119, thereby forming a first region 111a of the inner circuit layer 111 and the third part 115c of the via 115 as shown in FIG. 8.

As the second barrier layer 110e formed under the second metal layer 110b is exposed, the etching process is stopped and the first region 111a of the inner circuit layer 111 is formed. The first region 111a of the inner circuit layer 111 has a rectangular sectional shape formed thereon with the mask pattern 119.

Figure 9:
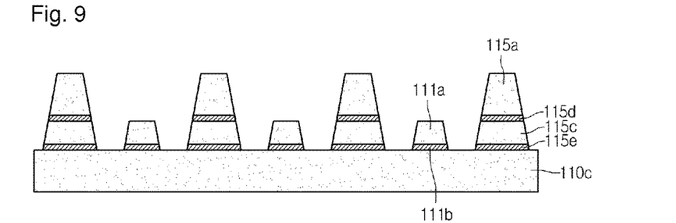

Then, as shown in FIG. 9, as the mask pattern 119 and the exposed second barrier metal layer 110e are removed, the inner circuit layer 111 is divided into the first region 111a formed by the second metal layer 110b and the second region 111b formed by the second metal barrier layer 110e.

Figure 10:
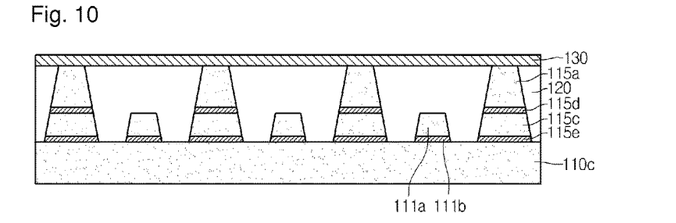

After that, as shown in FIG. 10, the first insulating layer 120 is formed in such a manner that the first and third parts 115a and 115c of the via 115 and the inner circuit layer 111 can be buried in the first insulating layer 120.

The first insulating layer 120 can be formed by using thermosetting resin or thermoplastic resin having the solid component, such as glass fiber, or having no solid component. The first insulating layer 120 may have the thickness in the range of about 30 μm to about 80 μm.

Then, a copper foil layer 130 is formed on the first insulating layer 120.

The copper foil layer 130 is a metal layer serving as a base of the first outer circuit layers 131 and 135 and has the thickness in the range of 6 μm to 30 μm such that the line/space can be formed as to 30/30 μm. Preferably, the copper foil layer 130 has the thickness in the range of 6 μm to 20 μm such that the line/space can be formed as to 15/15 μm or below.

The first insulating layer 120 and the copper foil layer 130 can be formed by using CCL (copper cladded laminate).

Figure 11:
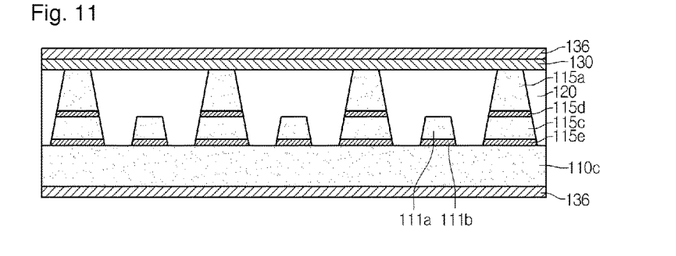

Then, as shown in FIG. 11, photoresist films 136 are formed on the copper foil layer 130 and under the metal substrate 110, respectively.

The photoresist film 136 formed under the metal substrate 110 serves as a base to form a photoresist pattern used to form the second part 115b of the via 115 and the inner circuit layer 111. In addition, the photoresist film 136 formed on the copper foil layer 130 serves as a base to form a photoresist pattern under the metal substrate 110 and as a protective film to protect the copper foil layer 130 during the etching process for the metal substrate 110.

Thus, the photoresist film 136 formed on the copper foil layer 130 can be replaced with a protective film or a protective organic layer and can be omitted.

Figure 12:
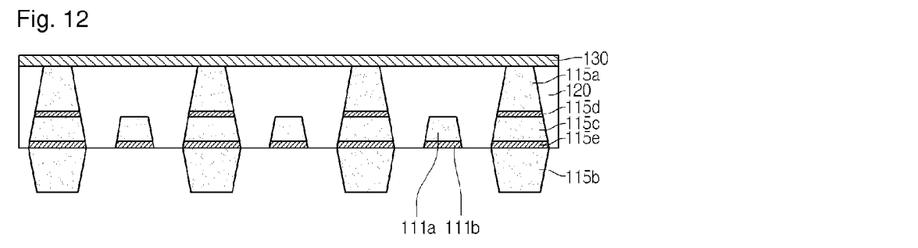

After that, as shown in FIG. 12, the photoresist film 136 formed under the metal substrate 110 is developed to form the photoresist pattern and the metal substrate 110 is etched by using the photoresist pattern as a mask, thereby forming the second part 115b under the first part 115a of the via 115.

The etching process may be performed until the second barrier metal layer 110e is exposed, so the second barrier metal layer 110e is exposed at the bottom surface of the inner circuit layer 111.

In this manner, upper and lower portions of the via 115 are divided into first to third parts 115a, 115b and 115c through the etching process so that the via 115 has the hexagonal sectional shape in which the center of the via 115 has the largest width d1 and the width becomes narrow from the center to the outer portion of the via 115.

Figure 13:
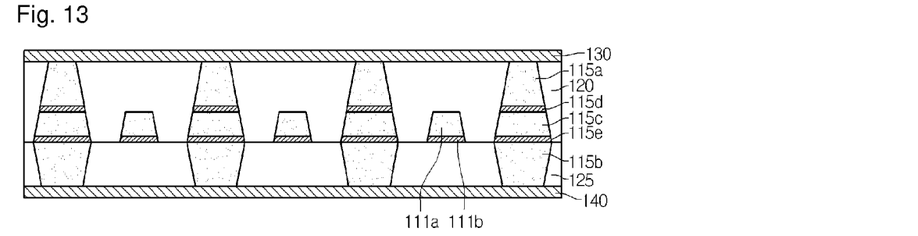

As the second part 115b of the via 115 has been formed, the photoresist pattern is delaminated. Then, as shown in FIG. 13, the second insulating layer 125 is deposited such that the first part 115a of the via 115 can be buried in the second insulating layer 125 and a copper foil layer 140 is deposited on the second insulating layer 125.

The material and the thickness of the second insulating layer 125 and the copper foil layer 140 may be identical to those of the first insulating layer 120 and the copper foil layer 130 formed on the first insulating layer 120.

Figure 14:
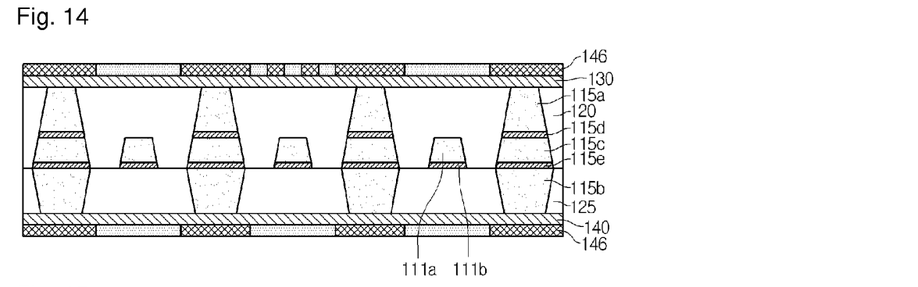

Then, as shown in FIG. 14, photoresist films 146 are attached onto the copper foil layers 130 and 140, respectively.

The photoresist films 146 may have various thicknesses in the range of 15 μm to 30 μm and both of the UV exposure type photoresist film and the LDI exposure type photoresist film can be employed.

Figure 15:
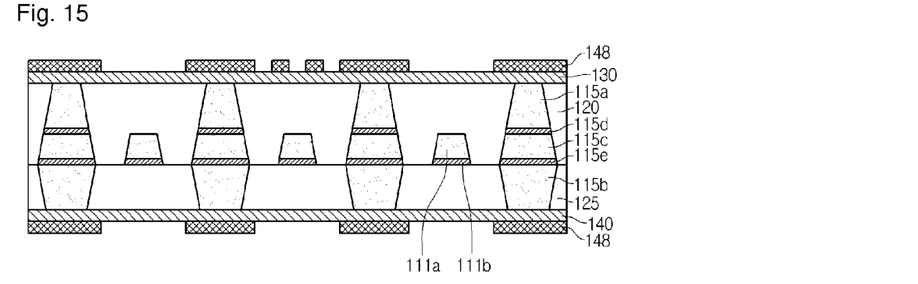
Figure 16:
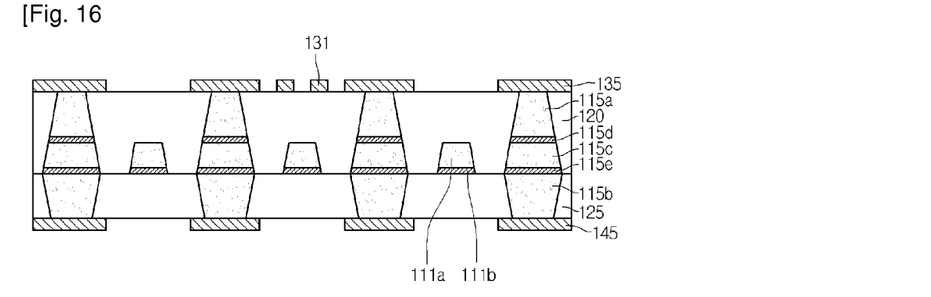

Then, the photoresist films 146 are subject to the exposure and development process so that photoresist patterns 148 are formed on the copper foil layers 130 and 140, respectively, as shown in FIG. 15. After that, the copper foil layers 130 and 140 are etched by using the photoresist patterns 148 as a mask, thereby forming the pads 135 and 145 and the circuit pattern 131 as shown in FIG. 16.

The pads 135 and 145 and the circuit pattern 131 may constitute the first outer circuit layers 131 and 135 formed on the first insulating layer 120 and the second outer circuit layer 145. The first outer circuit layers 131 and 135 include the upper pad 135 connected to the first part 115a of the via 115 and the upper circuit pattern 131 including the copper foil layer 130 identical to the copper foil layer 130 of the upper pad 135. The second outer circuit layer 145 includes the lower pad 145 connected to the second part 115b of the via 115 and a lower circuit pattern (not shown) including the copper foil layer 140 identical to the copper foil layer 140 of the lower pad 145.

Figure 17:
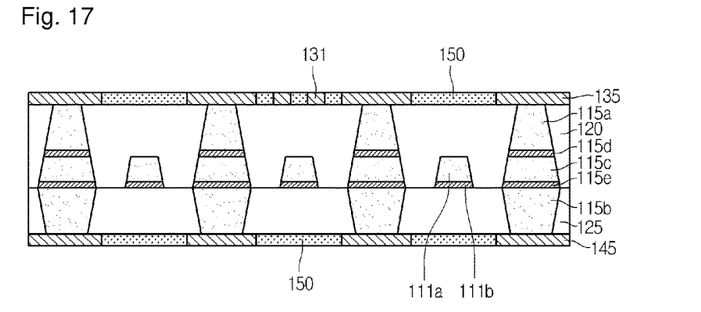

Finally, as shown in FIG. 17, the circuit pattern 131 of the outer circuit layers 131, 135 and 145 is buried and a coverlay 150 is formed to expose the pads 135 and 145.

In this manner, different from the related art in which the via hole is formed by drilling the insulating layer and the via is formed by burying the via hole, the embodiment forms the insulating layers 120 and 125 burying the via 115 after forming the via 115 by etching the metal substrate 110, thereby reducing the manufacturing cost. In addition, since the inner circuit layer 111 is formed by using the metal substrate identical to the via 115, the manufacturing steps can be reduced.

Hereinafter, a PCB according to the second embodiment will be described with reference to FIG. 18.

Figure 18:
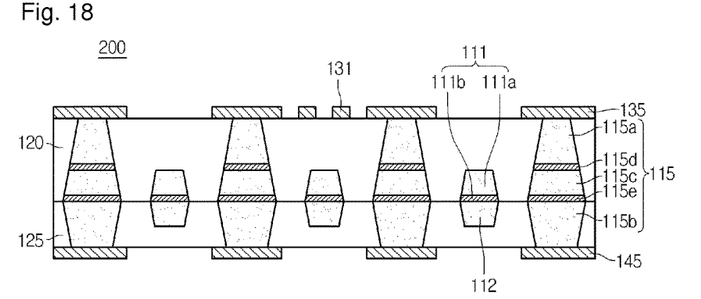
FIG. 18 is a sectional view showing a printed circuit board according to the second embodiment.

Referring to FIG. 18, the PCB 200 according to the second embodiment includes a core insulating layer forming a first insulating layer 120 and a second insulating layer 125, vias 115 formed in the core insulating layer, an inner circuit layer 112 formed in the core insulating layer, and first and second outer circuit layers 131, 135 and 145 formed on the first and second insulating layers 120 and 125, respectively.

The first insulating layer 120 is formed on the second insulating layer 125 and an additional insulating layer may be present between the first and second insulating layers 120 and 125.

The first and second insulating layers 120 and 125 can be formed by using resin including solid components, such as glass fiber. The first and second insulating layers 120 and 125 can be formed by using the same material.

The first and second insulating layers 120 and 125 have a stack structure to form the core insulating layer. The core insulating layer may have a thickness in the range of about 60 μm to about 140 μm. The via 115 and the inner circuit layer 112 are formed in the core insulating layer.

The vias 115 are conductive vias formed through the first and second insulating layers 120 and 125. The vias 115 have the largest width d1 at the boundary between the first and second insulating layers 120 and 125. The width of each via 115 is gradually narrowed as it reaches the top surface of the first and second insulating layers 120 and 125. Thus, the via 115 has a hexagonal sectional shape.

The widths d1 and d2 of the via 115 are in the range of about 20 μm to about 100 μm.

The via 115 is a conductive via and can be formed by using an alloy including Cu.

The via 115 includes a first part 115a buried in the first insulating layer 120 and formed by an alloy including Cu, a second part 115b buried in the second insulating layer 125 below the first part 115a and formed by an alloy identical to the alloy of the first part 115a, and a third part 115c interposed between the first and second parts 115a and 115b and formed by an alloy identical to the alloy of the first and second parts 115a and 115b.

Meanwhile, first and second barrier layers 115d and 115e are formed at boundaries among the first to third parts 115a, 115b and 115c.

In detail, the first barrier layer 115d is formed between the first part 115a and the third part 115c, and the second barrier layer 115e is formed between the third part 115c and the second part 115b.

The first and second barrier layers 115d and 115e are formed by using a metal different from the metal of the first to third parts 115a, 115b and 115c. The metal of the first and second barrier layers 115d and 115e has the etching selectivity with respect to the metal of the first to third parts 115a, 115b and 115c.

The third part 115c is formed at the center of the via 115, and the bottom surface of the third part 115c may have the largest width d1 of the via 115.

The first to third parts 115a, 115b and 115c can be formed by using the alloy including Cu, and the first and second barrier layers 115d and 115e can be formed by using the alloy including Ni, Fe, Co, Mo, Cr or Pd.

The first and second parts 115a and 115b have the thickness in the range of 20 μm to 70 μm, and the third part 115c has the thickness in the range of 5 μm to 70 μm.

The first and second barrier layers 115d and 115e have the thickness smaller than the thickness of the third part 115c. Preferably, the first and second barrier layers 115d and 115e have the thickness of about 10 μm or less.

The inner circuit layer 112 has a rectangular sectional shape and has the width of about 60 μm or less, preferably, 50 μm, so that the micro pattern can be formed.

The inner circuit layer 112 is formed by using a material the same as that of the third part 115c of the via 115.

The outer circuit layers 131, 135 and 145 including via pads 135 and 145 connected to the via 115 and the circuit pattern 131 are formed on the top and bottom surfaces of the first and second insulating layers 120 and 125, respectively.

The outer circuit layers 131, 135 and 145 are formed on the surfaces of the first and second insulating layers 120 and 125 and the inner circuit layer 112 is formed on the second insulating layer 125.

The outer circuit layers 131, 135 and 145 can be formed by depositing the copper foil layer and then etching the copper foil layer.

In the PCB 200 shown in FIG. 18, the circuit pattern of the inner circuit layer 112 has a rectangular sectional shape, which is symmetrically formed about the boundary between the first and second insulating layers 120 and 125 similar to the via 115. The region buried in the first insulating layer 120 includes the material the same as that of the third part 115c of the via 115, and the region buried in the second insulating layer 125 includes the material the same as that of the third part 115c of the via 115.

The inner circuit layer 112 shown in FIG. 18 can be formed by using the manufacturing method shown in FIGS. 3 to 17. In the process shown in FIGS. 11 and 12, when the second part 115b of the via 115 is formed, the region to be buried in the second insulating layer 125 of the inner circuit layer 112 can be simultaneously formed.

As described above, since the inner circuit layer 112 is buried in the core insulating layer of the PCB 200 according to the embodiment, the circuit layer having the number of 2n+1 (n is a positive integer) can be formed. In addition, the insulating layer has the number the same as that of the circuit layer on the basis of the core insulating layer so that the PCB can be prevented from being bent in one direction.

Thus, odd circuit layers can be formed without increasing the number of the insulating layers. In addition, since the vias 115 including the conductive material are formed in the core insulating layer, the heat dissipation efficiency can be improved.

In addition, an intermediate layer of the metal substrate is formed by using a hetero metal, so the metal substrate can be prevented from being bent during the manufacturing process.

Hereinafter, the PCB according to the third embodiment will be described with reference to FIGS. 19 to 36.

Figure 19:
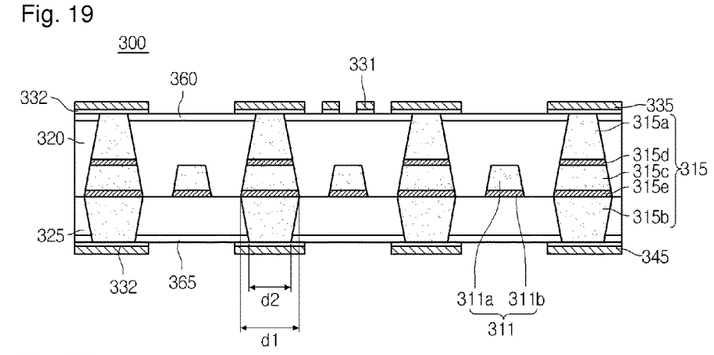
FIG. 19 is a sectional view showing a printed circuit board according to the third embodiment.

FIG. 19 is a sectional view showing the PCB according to the third embodiment.

Referring to FIG. 19, the PCB 300 according to the embodiment includes a core insulating layer forming a first insulating layer 320 and a second insulating layer 325, vias 315 formed in the core insulating layer, an inner circuit layer 311 formed in the core insulating layer, and first and second outer circuit layers 331, 335 and 345 formed on the first and second insulating layers 320 and 325, respectively.

The first insulating layer 320 is formed on the second insulating layer 325 and an additional insulating layer (not shown) may be present between the first and second insulating layers 320 and 325.

The first and second insulating layers 320 and 325 may include a thermosetting polymer substrate, a thermoplastic polymer substrate, a ceramic substrate or an organic/inorganic composite substrate. The first and second insulating layers 320 and 325 may include polymer resin, such as epoxy insulating resin, or polyimide resin. In addition, the first and second insulating layers 320 and 325 can be formed by using resin including solid components, such as glass fiber.

The first and second insulating layers 320 and 325 can be formed by using the same material.

The first and second insulating layers 320 and 325 may have a thickness in the range of about 30 μm to about 80 μm, respectively.

The thickness of the core insulating layer having the stack structure of the first and second insulating layers 320 and 325 is in the range of about 60 μm to about 160 μm, preferably, in the range of about 60 μm to about 140 μm.

Adhesive layers 360 and 365 are formed on the surfaces of the core insulating layer. In detail, the adhesive layers 360 and 365 are formed on the top surface of the first insulating layer 320 and the bottom surface of the second insulating layer 325, respectively.

The adhesive layers 360 and 365 are provided to reinforce the adhesive strength between the first and second insulating layers 320 and 325 and the circuit layers 331, 335 and 345. The adhesive layers 360 and 365 may be a primer resin layer including silane and may have a thickness of about 10 μm or less.

The vias 315 and the inner circuit layer 311 are formed in the core insulating layer.

The vias 315 are conductive vias formed through the first and second insulating layers 320 and 325. The vias 315 have the largest width d1 at the boundary between the first and second insulating layers 320 and 325. The width of each via 315 is gradually narrowed as it reaches the top surface of the first and second insulating layers 320 and 325. Thus, a section of each via 315 meeting with the top surface of the first and second insulating layers 320 and 325 has the smallest width d2, so that the via 315 has a hexagonal sectional shape.

The widths d1 and d2 of the via 315 are in the range of about 20 μm to about 300 μm.

The via 315 is a conductive via and can be formed by using an alloy including Cu.

The via 315 includes a first part 315a buried in the first insulating layer 320 and formed by an alloy including Cu, a second part 315b buried in the second insulating layer 325 below the first part 315a and formed by an alloy identical to the alloy of the first part 315a, and a third part 315c interposed between the first and second parts 315a and 315b and formed by an alloy identical to the alloy of the first and second parts 315a and 315b.

Meanwhile, first and second barrier layers 315d and 315e are formed at boundaries among the first to third parts 315a, 315b and 315c.

In detail, the first barrier layer 315d is formed between the first part 315a and the third part 315c, and the second barrier layer 315e is formed between the third part 315c and the second part 315b.

The first and second barrier layers 315d and 315e are formed by using a metal different from the metal of the first to third parts 315a, 315b and 315c. The metal of the first and second barrier layers 315d and 315e has the etching selectivity with respect to the metal of the first to third parts 315a, 315b and 315c.

The third part 315c is formed at the center of the via 315, and the bottom surface of the third part 315c or the bottom surface of the second barrier layer 315e may have the largest width d1 of the via 315.

The first to third parts 315a, 315b and 315c can be formed by using the alloy including Cu, and the first and second barrier layers 315d and 315e can be formed by using the alloy including Ni, Fe, Co, Mo, Cr or Pd.

The first and second parts 315a and 315b have the thickness in the range of 20 µm to 70 µm, and the third part 315c has the thickness in the range of 5 µm to 70 µm.

The first and second barrier layers 315d and 315e have the thickness smaller than the thickness of the third part 315c. Preferably, the first and second barrier layers 315d and 315e have the thickness of about 10 µm or less.

The inner circuit layer 311 is formed on the second insulating layer 325. A circuit pattern of the inner circuit layer 311 has the thickness in the range of 5 µm to 30 µm, and the width of about 50 µm or less, preferably, 30 µm, so that the micro pattern can be formed.

The inner circuit layer 311 has a rectangular sectional shape.

The inner circuit layer 311 is formed by using a material the same as that of the third part 315c of the via 315 and the second barrier layer 315e is partially formed under the inner circuit layer 311.

The second barrier layer 315e can be omitted.

The outer circuit layers 331, 335 and 345 including via pads 335 and 345 connected to the via 315 and the circuit pattern 331 are formed on the top and bottom surfaces of the first and second insulating layers 320 and 325, respectively.

The outer circuit layers 331, 335 and 345 are classified into the first outer circuit layers 331 and 335 formed on the core insulating layer and the second outer circuit layer 345 formed under the core insulating layer.

The outer circuit layers 331, 335 and 345 can be formed by plating materials through the SAP (semi-additive process).

Although it has been described in that the outer circuit layers 331, 335 and 345 are formed on and under the core insulating layer in the form of a single layer, the embodiment is not limited thereto. For instance, after forming an upper insulating layer for burying the outer circuit layers 331, 335 and 345 on the first and second insulating layers 320 and 325, the circuit layer can be formed on the upper insulating layer to form the multi-layer PCB.

As described above, since the inner circuit layer 311 is buried in the core insulating layer of the PCB 300 according to the embodiment, the circuit layer having the number of 2n+1 (n is a positive integer) can be formed. In addition, the insulating layer has the number the same as that of the circuit layer on the basis of the core insulating layer so that the PCB can be prevented from being bent in one direction.

Thus, odd circuit layers can be formed without increasing the number of the insulating layers. In addition, since the vias 315 including the conductive material are formed in the core insulating layer, the heat dissipation efficiency can be improved.

In addition, since the adhesive layers 360 and 365 including the primer resin are formed between the insulating layers 320 and 325 and the outer circuit layers 331, 335 and 345, the plating work for the outer circuit layers 331, 335 and 345 may be facilitated so that the adhesive strength between the insulating layers 320 and 325 and the outer circuit layers 331, 335 and 345 can be improved.

Hereinafter, the method for manufacturing the PCB of FIG. 19 will be described with reference to FIGS. 20 to 36.

Figure 20:
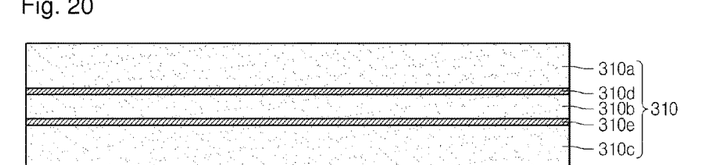
FIGS. 20 to 36 are sectional views for explaining the manufacturing procedure for the printed circuit board shown in FIG. 19.

First, a conductive metal substrate 310 is prepared as shown in FIG. 20.

The conductive metal substrate 310 can be formed by using an alloy including Cu in the form of a rolled foil or an electrolytic foil. The conductive metal substrate 310 may have various thicknesses according to the specification of the product. The conductive metal substrate 310 has the stack structure of a first metal layer 310a, a second metal layer 310b and a third metal layer 310c.

The first to third metal layers 310a, 310b and 310c can be formed by using an alloy including Cu. First and second barrier metal layers 310d and 310e are formed among the first to third metal layers 310a, 310b and 310c. The first and second barrier metal layers 310d and 310e include the metal having the etching selectivity with respect to the metal of the first to third metal layers 310a, 310b and 310c.

The first and second barrier metal layers 310d and 310e can be formed by using an alloy including Ni, Fe, Co, Mo, Cr or Pd. In addition, the first and second barrier metal layers 310d and 310e may have the thickness thinner than the thickness of the second metal layer 310b.

According to the embodiment, the metal substrate 310 preferably has the thickness in the range of 80 µm to 170 µm. The surface of the metal substrate 310 can be treated through a surface treatment process, such as pickling or flushing.

Figure 21:
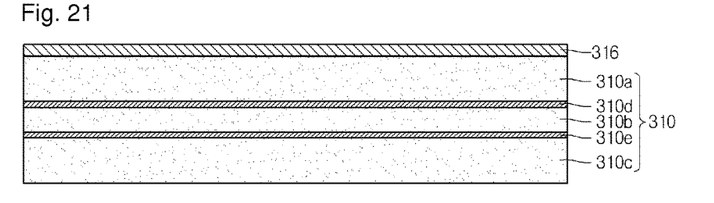

Then, as shown in FIG. 21, a photoresist film 316 is attached onto the top surface of the metal substrate 310.

The photoresist film 316 forms an etching pattern to etch the metal substrate 310.

The photoresist film 316 may have various thicknesses in the range of 15 µm to 30 µm, and both of the UV exposure type photoresist film and the LDI exposure type photoresist film can be employed.

Figure 22:
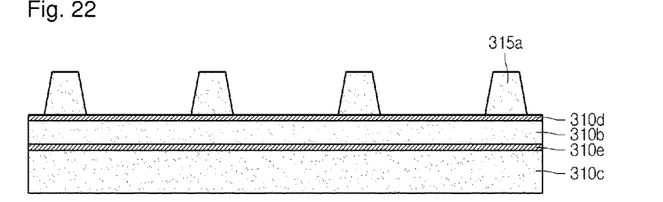

After that, as shown in FIG. 22, the photoresist film 316 is subject to the exposure and development process to form a photoresist pattern (not shown) and the metal substrate 310 is etched by using the photoresist pattern as a mask, thereby forming the first part 315a of the via 315.

Then, a part of the metal substrate 310 is wet etched by using wet etching solution, such as cupric chloride and iron chloride, to form the first part 315a of the via 315. Due to the etching selectivity between the first metal layer 310a and the first barrier metal layer 310d, only the first metal layer 310a is etched when the first part 315a is formed.

As shown in FIG. 22, after the first part 315a of the via 315 has been etched, the photoresist pattern is delaminated by using the NaOH diluted solution.

Figure 23:
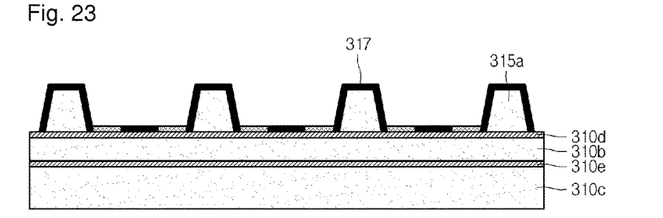

Next, as shown in FIG. 23, a photoresist film 317 is formed on the first part 315a and an exposed front surface of the first barrier metal layer 310d.

Figure 24:
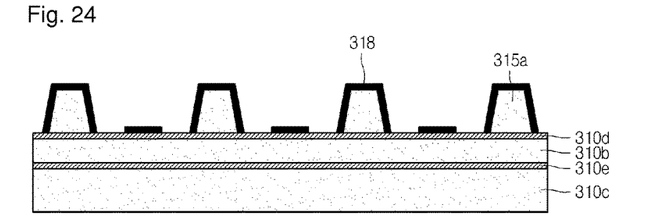

In order to form the inner circuit layer 311 by using the second metal layer 310b, a part of the photoresist film 317 formed on the first barrier metal layer 310d is subject to the exposure and development process to form a photoresist pattern 318 shown in FIG. 24 and the first barrier metal layer 310d is etched by using the photoresist pattern 318 as a mask, thereby forming a mask pattern 319.

Figure 25:
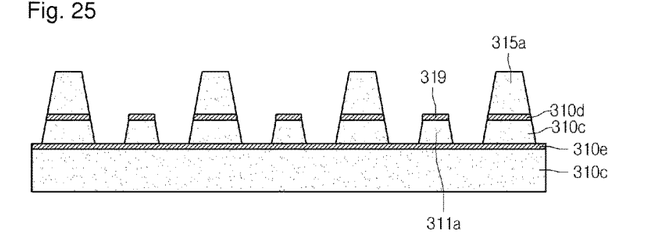

Then, the second metal layer 310b formed under the mask pattern 319 is selectively etched by using an etching solution different from the etching solution used for etching the mask pattern 319, thereby forming a first region 311a of the inner circuit layer 311 and the third part 315c of the via 315 as shown in FIG. 25.

As the second barrier layer 310e formed under the second metal layer 310b is exposed, the etching process is stopped and the first region 311a of the inner circuit layer 311 is formed. The first region 311a of the inner circuit layer 311 has a rectangular sectional shape formed thereon with the mask pattern 319.

Figure 26:
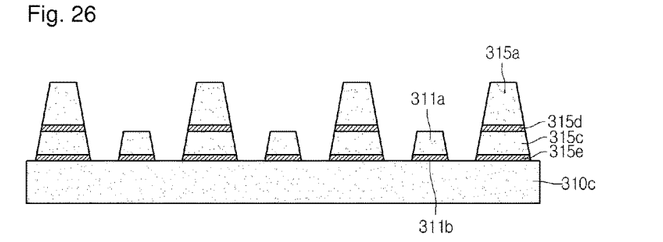

Then, as shown in FIG. 26, as the mask pattern 319 and the exposed second barrier metal layer 310e are removed, the inner circuit layer 311 is divided into the first region 311a formed by the second metal layer 310b and the second region 311b formed by the second metal barrier layer 310e.

Figure 27:
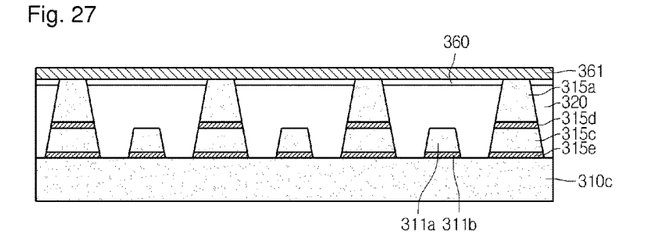

After that, as shown in FIG. 27, the first insulating layer 320 is formed in such a manner that the first and third parts 315a and 315c of the via 315 and the inner circuit layer 311 can be buried in the first insulating layer 320.

The first insulating layer 320 can be formed by using thermosetting resin or thermoplastic resin having the solid component, such as glass fiber, or having no solid component. The first insulating layer 320 may have the thickness in the range of about 30 μm to about 80 μm.

Then, the adhesive layer 360 and a copper foil layer 361 are formed on the first insulating layer 320.

The copper foil layer 361 serves as a base for the SAP and the adhesive layer 360 is attached onto the first insulating layer 320. The adhesive layer 360 includes primer resin.

In detail, the adhesive layer 360 includes primer resin including silane. The adhesive layer 360 including the primer resin is coated on the copper foil layer 361 in the form of the PCF (primer coated copper foil).

The top surface of the via 315 is pressed to make contact with the copper foil layer 361 through the adhesive layer 360.

Figure 28:
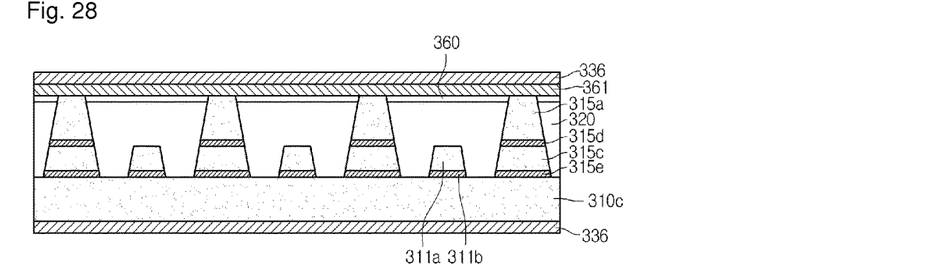

Then, as shown in FIG. 28, photoresist films 336 are formed on the copper foil layer 361 and under the metal substrate 310, respectively.

The photoresist film 336 formed under the metal substrate 310 serves as a base to form a photoresist pattern used to form the second part 315b of the via 315 and the inner circuit layer 311. In addition, the photoresist film 336 formed on the copper foil layer 361 serves as a base to form a photoresist pattern under the metal substrate 310 and as a protective film to protect the copper foil layer 361 during the etching process for the metal substrate 310.

Thus, the photoresist film 336 formed on the copper foil layer 361 can be replaced with a protective film or a protective organic layer and can be omitted.

Figure 29:
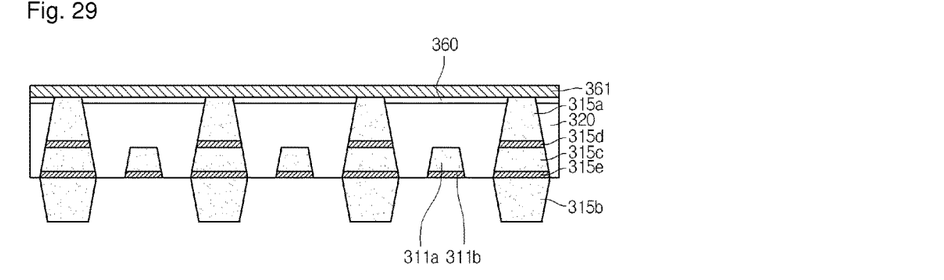

After that, as shown in FIG. 29, the photoresist film 336 formed under the metal substrate 310 is developed to form the photoresist pattern and the metal substrate 310 is etched by using the photoresist pattern as a mask, thereby forming the second part 315b under the first part 315a of the via 315.

The etching process may be performed until the second barrier metal layer 310e is exposed, so the second barrier metal layer 310e is exposed at the bottom surface of the inner circuit layer 311.

In this manner, upper and lower portions of the via 315 are divided into first to third parts 315a, 315b and 315c through the etching process so that the via 315 has the hexagonal sectional shape in which the center of the via 315 has the largest width d1 and the width becomes narrow from the center to the outer portion of the via 315.

Figure 30:
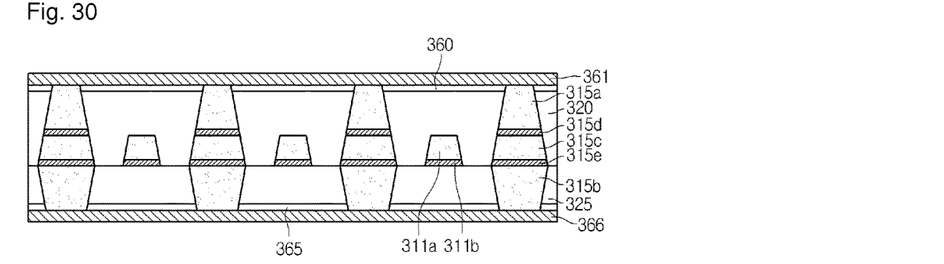

As the second part 315b of the via 315 has been formed, the photoresist pattern is delaminated. Then, as shown in FIG. 30, the second insulating layer 325 is deposited such that the first part 315a of the via 315 can be buried in the second insulating layer 325 and a copper foil layer 366 is deposited on the second insulating layer 325.

The material and the thickness of the second insulating layer 325 and the copper foil layer 366 may be identical to those of the first insulating layer 320 and the copper foil layer 361 formed on the first insulating layer 320.

Figure 31:
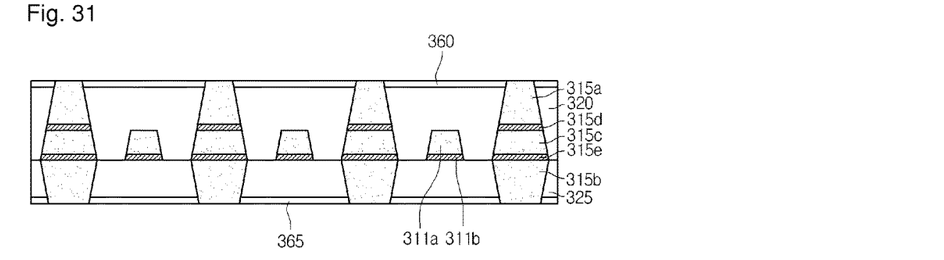

Then, as shown in FIG. 31, the copper foil layers 361 and 366 are removed so that the adhesive layers 360 and 365 under the copper foil layers 361 and 366 can be exposed.

The copper foil layers 361 and 366 are full-etched in order to perform the SAP, and the desmear process can be performed to remove impurities from the adhesive layers 360 and 365 and to provide the intensity of illumination.

Figure 32:
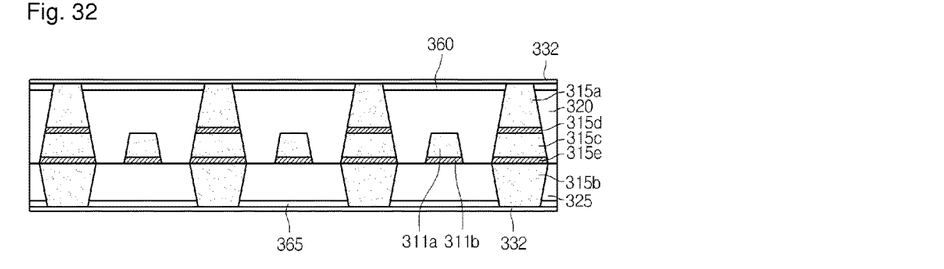

Then, as shown in FIG. 32, a seed layer 332 is formed on the adhesive layers 360 and 365 through the electroless plating process.

That is, the seed layer 332 can be formed by performing the electroless plating process using Cu. The seed layer 332 is formed on the adhesive layers 360 and 365 and on the exposed top and bottom surfaces of the via 315 with the uniform thickness of 3 μm or less.

Figure 33:
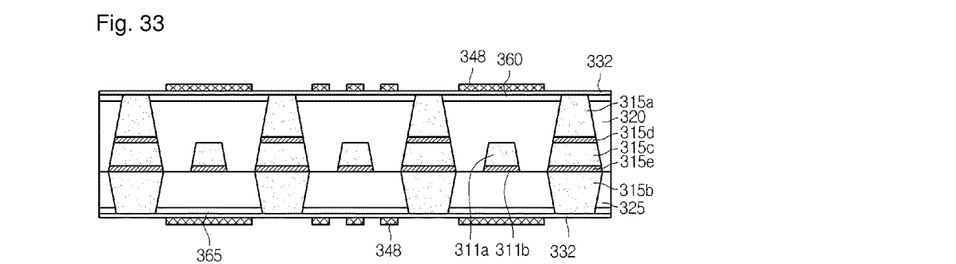

After that, as shown in FIG. 33, a photoresist pattern 348 is formed on the seed layer 332 to form the outer circuit layers 331, 335 and 345.

The photoresist pattern 348 can be formed by performing the exposure and development process with respect to the photoresist film according to the circuit design.

Figure 34:
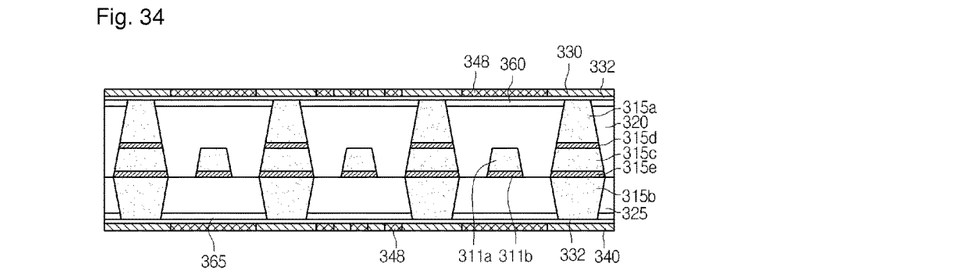

Then, as shown in FIG. 34, plating layers 330 and 340 are formed by performing the electroplating process onto the seed layer 332 exposed through the photoresist pattern 348.

According to the electroplating process, the plating area is calculated and current is applied to a DC rectifier or a pulse/reverse type rectifier to extract the conductive metal, such as copper.

Figure 35:
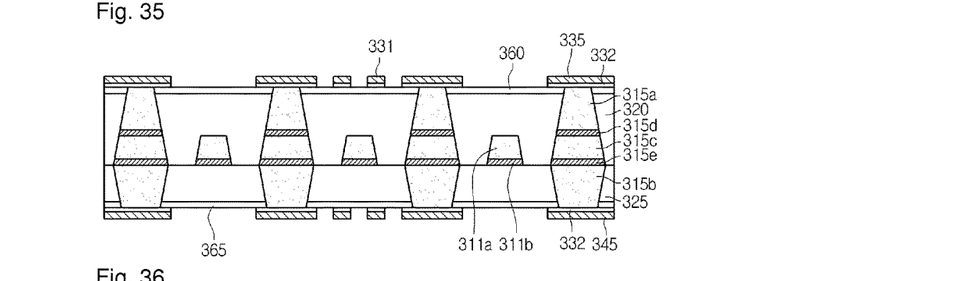

Then, as shown in FIG. 35, the photoresist pattern 348 is delaminated and the flash etching process is performed with respect to the plating layers 330 and 340 and the seed layer 332 under the photoresist pattern 348, so that the adhesive layers 360 and 365 are exposed and the outer circuit layers 331, 335 and 345 are formed.

The pads 335 and 345 and the circuit pattern 331 may constitute the first outer circuit layers 331 and 335 formed on the first insulating layer 320 and the second outer circuit layer 345. The first outer circuit layers 331 and 335 include the upper pad 335 connected to the first part 315a of the via 315 and the upper circuit pattern 331. The second outer circuit layer 345 includes the lower pad 345 connected to the second part 315b of the via 315 and a lower circuit pattern (not shown).

Figure 36:
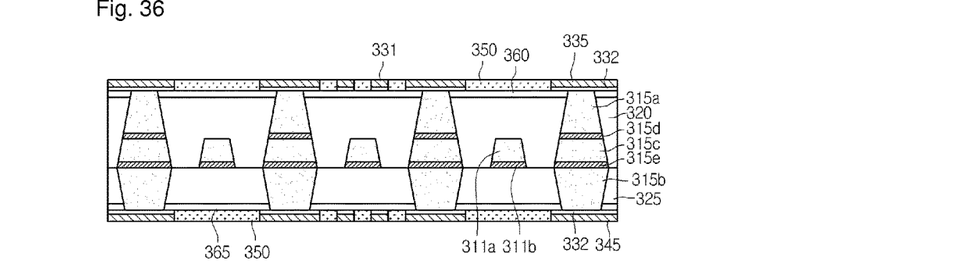

Finally, as shown in FIG. 36, the circuit pattern 331 of the outer circuit layers 331, 335 and 345 is buried and a coverlay 350 is formed to expose the pads 335 and 345.

In this manner, different from the related art in which the via hole is formed by drilling the insulating layer and the via is formed by burying the via hole, the embodiment forms the insulating layers 320 and 325 burying the via 315 after forming the via 315 by etching the metal substrate 310, thereby reducing the manufacturing cost. In addition, since the inner circuit layer 311 is formed by using the metal substrate identical to the via 315, the manufacturing steps can be reduced.

In addition, the outer circuit layers 331, 335 and 345 are formed through the SAP, so that the micro pattern can be formed.

Hereinafter, a PCB according to the fourth embodiment will be described with reference to FIG. 37.

Figure 37:
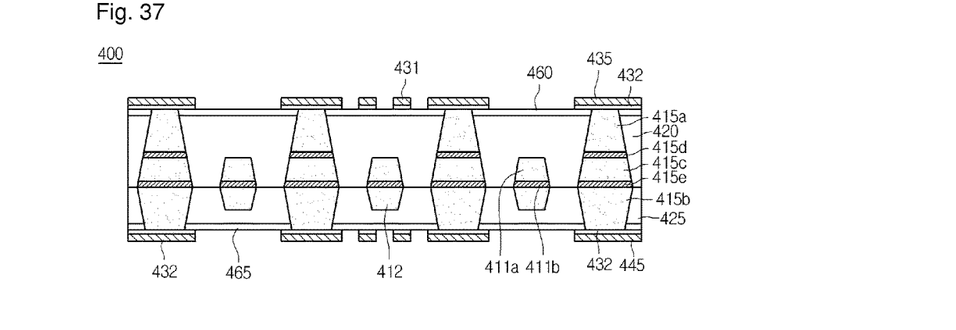
FIG. 37 is a sectional view showing a printed circuit board according to the fourth embodiment.

Referring to FIG. 37, the PCB 400 according to the fourth embodiment includes a core insulating layer forming a first insulating layer 420 and a second insulating layer 425, vias 415 formed in the core insulating layer, an inner circuit layer 412 formed in the core insulating layer, and first and second outer circuit layers 431, 435 and 445 formed on the first and second insulating layers 420 and 425, respectively.

The first insulating layer 420 is formed on the second insulating layer 425 and an additional insulating layer may be present between the first and second insulating layers 420 and 425.

The first and second insulating layers 420 and 425 can be formed by using resin including solid components, such as glass fiber. The first and second insulating layers 420 and 425 can be formed by using the same material.

The first and second insulating layers 420 and 425 have a stack structure to form the core insulating layer. The core insulating layer may have a thickness in the range of about 60 μm to about 140 μm.

Adhesive layers 460 and 465 are formed on the surfaces of the core insulating layer. In detail, the adhesive layers 460 and 465 are formed on the top surface of the first insulating layer 420 and the bottom surface of the second insulating layer 425, respectively.

The adhesive layers 460 and 465 are provided to reinforce the adhesive strength between the first and second insulating layers 420 and 425 and the circuit layers 431, 435 and 445. The adhesive layers 460 and 465 may be a primer resin layer including silane and may have a thickness of about 10 μm or less. The via 415 and the inner circuit layer 412 are formed in the core insulating layer.

The vias 415 are conductive vias formed through the first and second insulating layers 420 and 425. The vias 415 have the largest width at the boundary between the first and second insulating layers 420 and 425. The width of each via 415 is gradually narrowed as it reaches the top surface of the first and second insulating layers 420 and 425. Thus, the via 415 has a hexagonal sectional shape.

The widths d1 and d2 of the via 415 are in the range of about 20 μm to about 100 μm.

The via 415 is a conductive via and can be formed by using an alloy including Cu.

The via 415 includes a first part 415a buried in the first insulating layer 420 and formed by an alloy including Cu, a second part 415b buried in the second insulating layer 425 below the first part 415a and formed by an alloy identical to the alloy of the first part 415a, and a third part 415c interposed between the first and second parts 415a and 415b and formed by an alloy identical to the alloy of the first and second parts 415a and 415b.

Meanwhile, first and second barrier layers 415d and 415e are formed at boundaries among the first to third parts 415a, 415b and 415c.

In detail, the first barrier layer 415d is formed between the first part 415a and the third part 415c, and the second barrier layer 415e is formed between the third part 415c and the second part 415b.

The first and second barrier layers 415d and 415e are formed by using a metal different from the metal of the first to third parts 415a, 415b and 415c. The metal of the first and second barrier layers 415d and 415e has the etching selectivity with respect to the metal of the first to third parts 415a, 415b and 415c.

The third part 415c is formed at the center of the via 415, and the bottom surface of the third part 415c may have the largest width d1 of the via 415.

The first to third parts 415a, 415b and 415c can be formed by using the alloy including Cu, and the first and second barrier layers 415d and 415e can be formed by using the alloy including Ni, Fe, Co, Mo, Cr or Pd.

The first and second parts 415a and 415b have the thickness in the range of 20 μm to 70 μm, and the third part 415c has the thickness in the range of 5 μm to 70 μm.

The first and second barrier layers 415d and 415e have the thickness smaller than the thickness of the third part 115c. Preferably, the first and second barrier layers 115d and 115e have the thickness of about 10 μm or less.

The outer circuit layers 431, 435 and 445 including via pads 435 and 445 connected to the via 415 and the circuit pattern 431 are formed on the top and bottom surfaces of the first and second insulating layers 420 and 425, respectively.

The outer circuit layers 431, 435 and 445 are formed on the surfaces of the first and second insulating layers 420 and 425 and the inner circuit layer 412 is formed between the first and second insulating layers 420 and 425.

The outer circuit layers 431, 435 and 445 can be formed through the SAP.

In the PCB 400 shown in FIG. 37, the circuit pattern of the inner circuit layer 412 has a rectangular sectional shape, which is symmetrically formed about the boundary between the first and second insulating layers 420 and 425 similar to the via 415. The region buried in the first insulating layer 420 includes the material the same as that of the third part 415c of the via 415, and the region buried in the second insulating layer 425 includes the material the same as that of the third part 415c of the via 415.

The inner circuit layer 412 shown in FIG. 37 can be formed by using the manufacturing method shown in FIGS. 20 to 36.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:
1. A printed circuit board comprising:
a first insulating layer;
a second insulating layer below the first insulating layer;
a via formed through the first insulating layer and the second insulating layer;
an inner circuit layer on the second insulating layer and buried in the first insulating layer; and an outer circuit layer on a top surface of the first insulating layer or a bottom surface of the second insulating layer;

wherein the via includes:

a first part, a second part below the first part, a third part between the first and second parts, a first barrier layer between the first part and the third part, and a second barrier layer between the third part and the second part;

wherein a side surface of the third part of the via has a first predetermined inclination angle with respect to a top surface of the first insulating layer;

wherein the inner circuit layer includes:

a third barrier layer on the second insulating layer and horizontally spaced apart from the via, and an inner circuit pattern on the third barrier layer and horizontally spaced apart from the via;

wherein a bottom surface of the third barrier layer is at a same level as a top surface of the second part;

wherein the via has a hexagon sectional shape;

wherein a shape of the third barrier layer is same as a shape of the second barrier layer, and a shape of the inner circuit pattern is same as a shape of the third part; and wherein the inner circuit pattern and the third barrier layer each has a trapezoid sectional shape.

2. The printed circuit board of claim 1, wherein the inner circuit pattern is formed with a material identical to a material of the third part of the via.

3. The printed circuit board of claim 1, wherein the first part, the second part, and the third part of the via are formed with a same material.

4. The printed circuit board of claim 1, wherein the first, second and third barrier layers are formed with a same material.

5. The printed circuit hoard of claim 1, wherein the printed circuit board comprises a circuit layer including the inner circuit layer and the outer circuit layer and having a number of 2n+1 (n is a positive integer).

6. The printed circuit board of claim 1, further comprising an adhesive layer formed on the top surface of the first insulating layer or the bottom surface of the second insulating layer with clearance to expose the via.

7. The printed circuit board of claim 6, wherein the adhesive layer includes primer resin.

8. The printed circuit board of claim 1, wherein a side surface of the first part of the via has a second predetermined inclination angle with respect to the top surface of the first insulating layer, and wherein the first predetermined inclination angle is same as the second predetermined inclination angle.

9. The printed circuit board of claim 4, wherein a width of a top surface of the third part is same as a width of the bottom surface of the first barrier layer.

10. The printed circuit board of claim 6, wherein the outer circuit layer comprises a seed layer on the adhesive layer.

11. The printed circuit board of claim 10, wherein the seed layer comprises a first bottom surface contacting with a top surface of the adhesive layer and a second bottom surface contacting with a top surface of the first part of the via.

12. The printed circuit board of claim 6, wherein the adhesive layer is contacted with a side surface of the first part of the via.

13. The printed circuit board of claim 12, wherein a top surface of the adhesive layer portions lies on a same plane as a top surface of the first part of the via.

* * * * *